US008489943B2

(12) United States Patent
Dwivedi et al.

(10) Patent No.: US 8,489,943 B2
(45) Date of Patent: Jul. 16, 2013

(54) PROTOCOL SEQUENCE GENERATOR (75) Inventors: Anil K. Dwivedi, Noida (IN); Akhilesh Chandra, Noida (IN); Ajay Arun Kulkarni, Mumbai (IN)

(73) Assignee: STMicroelectronics International N.V., Amsterdam (NL)

( * ) Notice: Subject to any disclaimer, the term of this patent is extended or adjusted under 35 U.S.C. 154(b) by 302 days.

(21) Appl. No.: 12/751,111

(22) Filed: Mar. 31, 2010

(65) Prior Publication Data
US 2011/0145644 A1 Jun. 16, 2011

(30) Foreign Application Priority Data
Dec. 15, 2009 (IN) .......................... 2604/DEL/2009

(51) Int. Cl.
*G11C 29/00* (2006.01)
(52) U.S. Cl.
USPC ................ 714/718; 714/32; 714/34; 714/30; 714/6.21; 714/6.2; 714/733; 714/734; 714/738; 714/742; 365/201
(58) Field of Classification Search
USPC ........................................................ 714/718
See application file for complete search history.

(56) References Cited

U.S. PATENT DOCUMENTS

| | | | |
|---|---|---|---|
| 7,062,688 B2 | 6/2006 | Gauthier et al. | |
| 7,385,861 B1 | 6/2008 | Zhu | |
| 2003/0120989 A1* | 6/2003 | Zumkehr | 714/738 |
| 2005/0289428 A1* | 12/2005 | Ong | 714/742 |
| 2006/0156134 A1* | 7/2006 | Mukherjee et al. | 714/733 |
| 2006/0198233 A1* | 9/2006 | Smith et al. | 365/233 |
| 2006/0248393 A1* | 11/2006 | Hatakeyama | 714/30 |
| 2007/0079198 A1* | 4/2007 | Komura | 714/733 |
| 2008/0086663 A1* | 4/2008 | Park et al. | 714/718 |
| 2009/0063913 A1* | 3/2009 | Yamasaki et al. | 714/718 |

OTHER PUBLICATIONS

Dreibelbis, J.; Barth, J.; Kalter, H.; Kho, R.; , "Processor-based built-in self-test for embedded DRAM," Solid-State Circuits, IEEE Journal of, vol. 33, No. 11, pp. 1731-1740, Nov. 1998.*
Srikanth Alaparthi, et al., "Methodologies and Challenges in Testing of High-Speed I/O Interfaces," Texas A&M University, College Station, TX, http://prasanthjampani.com/CourseWork/TestingPaper HighspeedIO.pdf, Sep. 2009, pp. 1-6.
Paul F. Scrivens, "Resolving Test Challenges for High-Speed Interfaces," Entrepreneur, http://www.entrepreneur.com/tradejournals/artical/print/203767425.html, Jul. 2009, pp. 1-4.
Mandapati K. Chaitanya, "FPGA Design Flow," http://www.vlsi-world.com/content/view/28/47/, Sep. 2009, pp. 1-6.
"JEDEC Standard DDR2 SDRAM Specification, JESD79-2F (revision of JESD79-2E)," JEDEC Solid State Technology Association, http://www.jedec.org/download/search/JESD79-2E.pdf, Nov. 2009, pp. 1-130.

* cited by examiner

*Primary Examiner* — John Trimmings
(74) *Attorney, Agent, or Firm* — Hogan Lovells US LLP (57) ABSTRACT

A system for generating test signals to test characteristics of input-output (IO) cells includes a memory and a processor coupled together through an integrated circuit (IC) chip. The IC chip includes a controller configured to exchange signals between the memory and the processor through IO cells of the IC chip. The IC chip further includes a protocol sequence generator for generating test signals for testing characteristics of the IO cells.

13 Claims, 7 Drawing Sheets

PROTOCOL SEQUENCE GENERATOR

RELATED APPLICATION

The present application claims priority of India Patent Application No. 2604/DEL/2009 filed Dec. 15, 2009, which is incorporated herein in its entirety by this reference.

FIELD OF THE INVENTION

The present invention generally relates to generating test signals and, more particularly, to generating test signals to test characteristics of input-output (IO) cells of an integrated circuit (IC) chip.

BACKGROUND

Generally, computing devices, such as computers, laptops, and servers, include a memory and a processor. The memory and the processor exchange data with the help of a controller. The controller, which is usually implemented in an integrated circuit (IC) chip, facilitates exchange of data in the form of data signals. The data signals are sent through input-output (IO) cells of the IC chip.

The frequency of operation of the memory and that of the IO cells has considerably increased over the years. In addition, the amount of data exchanged per unit time, also called a data rate, has also increased. Traditionally, data signals were exchanged at one edge of a clock cycle, such as in a Single Data Rate (SDR) Synchronous Dynamic Random Access Memory (SDRAM). Nowadays, exchange of data signals at both edges of the clock cycle, such as in a Dual Data Rate (DDR) SDRAM, has also become popular.

With the increasing data rate, the controller and IO cells have also been upgraded. This upgrade is necessary for reliable operation of the IO cells at the increased frequency. Even a small variation in the clock signal or the data signals may cause timing skews or uncertainty in the data signals at the memory input.

Timing skews or uncertainty in the data signals is mainly caused by a jitter in the clock signal or the data signals. A jitter is any variation in the rising or falling edge of a signal from its ideal position. It can be measured as the time difference between the actual rising or falling edge and the corresponding ideal rising or falling edge of the signal. For reliable exchange of data signals, jitter specifications should be within certain limits, as specified by a standardization body called "Joint Electron Device Engineering Council" (JEDEC). For example, for a 400 MHz DDR2 SDRAM data signals, a cycle-to-cycle jitter, a duty cycle jitter, and a period jitter should be within 200 ps, 100 ps, and 100 ps, respectively.

The IO cells thus need to be designed accordingly to keep jitter specifications within desired limits for a given system. The designers of the IO cells have to ensure that the jitter specifications are met. In addition, with the increasing frequency of operation, the time for which data signal is valid is also decreasing. The IO cells, thus, have to be tested to ensure that signals being exchanged through the IO cells are reliably communicated to the memory input.

SUMMARY

The present subject matter describes systems and methods for generating test signals for testing characteristics of input-output (IO) cells of an integrated circuit (IC) chip. The systems and methods, in particular, relate to generating test signals to test characteristics of IO cells exchanging data at dual data rate (DDR).

In an implementation, the system includes a memory and a processor coupled to the IC chip. The IC chip includes a controller, a protocol sequence generator, and IO cells. The controller is configured to exchange signals between the memory and the processor through the IO cells. The protocol sequence generator generates test signals to test characteristics of the IO cells. The protocol sequence generator receives an external clock signal and control signals to generate the test signals.

These and other features, aspects, and advantages of the present subject matter will be better understood with reference to the following description. This summary is provided to introduce a selection of concepts. This summary is not intended to identify key features or essential features of the claimed subject matter, nor is it intended to be used for to limiting the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION OF PREFERRED EMBODIMENTS

The disclosed subject matter relates to systems and methods for generating test signals to test characteristics of input-output (IO) cells of an integrated circuit (IC) chip. The systems and methods as described herein relate to generating test signals for testing characteristics of IO cells used for exchange of signals at dual data rate (DDR).

Generally, computing devices, such as computers, laptops, servers, personal digital assistants (PDAs), include one or more processors to perform different tasks. These computing devices also include one or more controllers and one or more memories, such as a Read Only Memory (ROM), Random Access Memory (RAM), and Synchronous Dynamic Random Access Memory (SDRAM). A controller, which is fabricated on an integrated circuit (IC) chip, exchanges data signals with a memory through input-output (IO) cells on the IC chip.

The rate of exchange of data signals, also known as a data rate, has increased tremendously over the years. The data signals are exchanged in synchronization with a clock signal of a certain frequency. Such a clock-synchronized-exchange of data signals with the memory is the basis for SDRAM and its later implementations, such as a Dual Data Rate (DDR) SDRAM, a DDR2 SDRAM, and a DDR3 SDRAM. The data signals are aligned with the clock signal and sampled at an edge of the clock signal so that the data signals can be reliably exchanged through the IO cells. Any variation in the clock signal, such as jitter and crosstalk, may introduce timing skews between the data signals and the clock signal, thus preventing synchronization and reliable communication of data.

The design of the IO cells conform to certain standard specifications as specified by a standardization body, for example, "Joint Electron Device Engineering Council" (JEDEC). These standards specify one or more parameters of the clock signal, such as a cycle to cycle jitter, a clock period jitter, and a duty cycle jitter. For example, the DDR SDRAM controller generates signals that comply with the DDR SDRAM standard specification for exchange of data signals through the IO cells.

In order to test whether the IO cells conform to the standard specifications, test signals that conform to the standard specifications can be passed through the IO cells. After passing through the IO cells, the test signals can be analyzed to determine whether the IO cells conform to the standard specifications.

In an embodiment of the present subject matter, a protocol sequence generator (PSG) generates test signals to test characteristics of the IO cells of the IC chip. The test signals are generated in accordance with various set standards for exchanging data signals. The test signals are fed to the IO cells and then analyzed by a standard analyzer circuit, such as a DDR analyzer.

The PSG operates upon the instantiation of a test mode of operation. The PSG generates the test signals based on an external clock signal and one or more control signals. In addition, the PSG can receive a test pattern externally and synchronize it in conformance to the set standards. The PSG can also control the number of the IO cells that can receive the test signals.

In an implementation of the said embodiment, the protocol sequence generator is a DDR protocol sequence generator (DPSG). The DPSG can generate test signals for simulating a write cycle in a DDR SDRAM. The DPSG generates the test signals for testing characteristics of the IO cells used to exchange data signals based on the DDR protocol. These IO cells are also referred to as DDR IO cells. The test signals may include one or more bits of a data signal, a data strobe signal, a DDR clock signal, a write enable signal or a combination thereof.

In another implementation, the DPSG may also control the number of bits, for example, two bits, four bits, or eight bits, of the data signal to be generated based on a data debug signal. This controlling can be used to measure timing skews in the data strobe signal and the DDR clock signal. These timing skews may be caused by the DDR IO cells, the phenomenon being referred to as crosstalk. The bits of the data signal can be subsequently activated to analyze the characteristics of the DDR IO cells with respect to the number of DDR IO cells that are operating.

The DPSG may generate the bits of the data signal internally or may take the bits of the data signal from an external source. The DPSG may further synchronize and sequence the bits of the data signal, the data strobe signal, and the DDR clock signal according to the DDR protocol. In an implementation, the test signals may be generated according to a write cycle in a memory. During a write operation to the memory, when a write enable signal becomes high, the data strobe signal and the bits of the data signal remain in a high impedance state until a write latency period has elapsed. Upon the expiration of the write latency period, the data strobe signal and the bits of the data signal are transmitted to the memory. The data strobe signal may also have a preamble before the data is transmitted.

The DPSG may also generate signals to introduce the high impedance state in the test signals until the write latency period has elapsed. The bits of the data signal may be center aligned to the data strobe signal, while the data strobe signal may be edge aligned to the DDR clock signal by the DPSG. In an implementation, the DPSG may generate the data strobe signal and the DDR clock signal in a differential mode.

The PSG or the DPSG may be fabricated along with the controller in a core of the IC chip. The IO cells of the IC chip can thus be tested on-site, at any time. Further, during a test mode of operation, the signals from the controller may be deactivated and the test signals can be given to the IO cells. In an implementation, the PSG can be implemented in any memory, such as a synchronous dynamic random access memory (SDRAM), dual data rate (DDR) SDRAM, and DDR2 SDRAM. The PSG may also be implemented in controllers for the above memories. Devices that may implement the disclosed PSG include, but are not limited to, set-top boxes, computing devices, televisions, mobile phones, laptops, personal digital assistants (PDAs), and so on. These devices can be employed in a variety of applications, such as data gathering and/or processing, streaming, conferencing, and surveillance.

While aspects of described systems and methods for the PSG may be implemented in any number of different computing systems, environments, and/or configurations, the embodiments are described in the context of the following exemplary system architecture(s). The descriptions and details of well-known components are omitted for simplicity of the description. Accordingly, the logic level of control signals can either be active low or active high. It will be appreciated by those skilled in the art that the words during, while, and when as used herein are not exact terms that mean an action takes place instantly upon an initiating.

As it will be understood, the present subject matter can take the form of an entirely hardware embodiment, an entirely software embodiment, or an embodiment containing both hardware and software elements.

Figure 1:
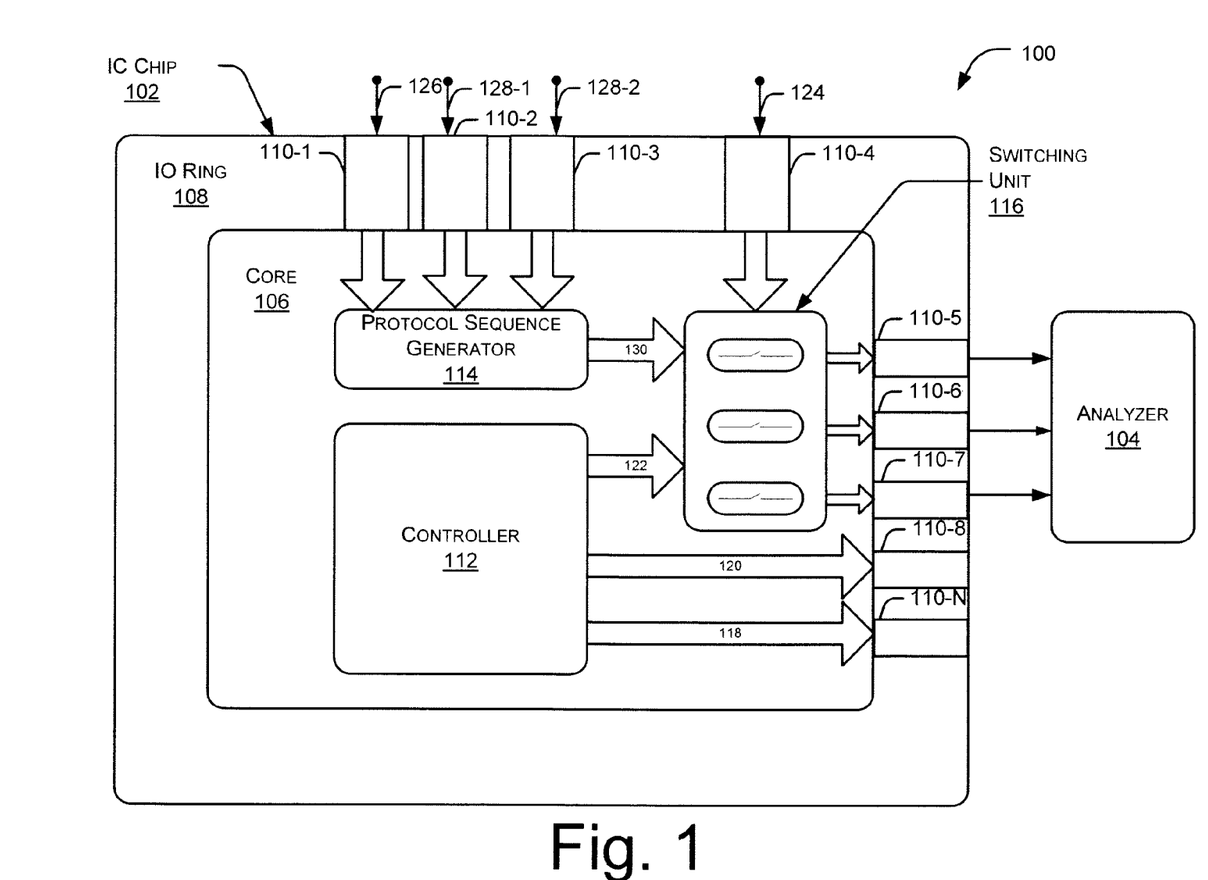
FIG. 1 illustrates an exemplary system to analyze characteristics of an input-output (IO) cell of an integrated circuit (IC) chip.

FIG. 1 illustrates an exemplary system 100 to test characteristics of an input-output (IO) cell of an integrated circuit (IC) chip 102. The system 100 includes the IC chip 102 and an analyzer 104. The IC chip 102 includes a core 106 and an IO ring 108. The IO ring 108 exchanges signals between the core 106 and peripheral circuits, for example the analyzer 104, a memory, a processor, etc., through IO cells 110-1, 110-2, ..., 110-*n*, collectively referred to as IO cells 110.

Further, the core 106 includes, a controller 112, a protocol sequence generator (PSG) 114, and a switching unit 116. The PSG 114 generates test signals for testing characteristics of the IO cells 110. The switching unit 116 provides signals to the IO cells 110 from the controller 112 or from the PSG 114 based on a mode of operation of the IC chip 102.

The controller 112 facilitates exchange of data signals between the memory and the processor (both not shown in the figure) to facilitate read or write (R/W) operations from or to the memory. The controller 112 may facilitate exchange of various types of signals including data signals, data strobe signals, memory address signals, control command signals, and a clock signal during a normal mode of operation of the IC chip 102. The controller 112 may be fabricated for a specific type of memory. For example, for a Dual Data Rate (DDR) Synchronous Dynamic Random Access Memory (SDRAM), the controller 112 is a DDR SDRAM controller. In response to a write command signal from the processor, the DDR SDRAM controller sends signals, which may include, for example, a write enable control signal, data signals, a data strobe signal, a memory address signal, a clock signal, or a combination thereof, to enable a write operation to the memory. These signals are exchanged between the DDR SDRAM controller and the DDR SDRAM through the IO cells 110, for example, the DDR IO cells.

During a normal mode of operation, the signals from the controller 112 are exchanged through various buses. In an implementation, the buses may include an address bus 118 that exchanges signals indicating an address location with the memory through the IO cells 110. Further, a command bus 120 exchanges signals with the memory indicating various functions, for example, a read operation from the memory and a write operation to the memory, to be performed by the controller 112. These signals are also exchanged through the IO cells 110. Furthermore, a controller data bus 122 exchanges data signals with the memory through the IO cells 110.

As mentioned previously, the IC chip 102 includes the PSG 114. The PSG 114 generates the test signals to test the characteristics of the IO cells 110. In an implementation, the PSG 114 can be implemented as a dual data rate (DDR) protocol sequence generator to test the characteristics of DDR IO cells. The test signals may include multiple bits of a data signal, collectively referred to as data signals, a data strobe signal, and a clock signal.

The test signals are generated upon instantiation of a test mode of operation. The test mode of operation is indicated by receiving a test mode enable signal 124 through an IO cell, for example, the IO cell 110-4. Upon instantiation of the test mode of operation, the PSG 114 receives an external clock signal 126 through another IO cell, for example, the IO cell 110-1. The PSG 114 also receives control signals, such as a reset signal 128-1 and a write enable signal 128-2, through two IO cells of the IO cells 110, for example the IO cells 110-2 and 110-3. The reset signal 128-1 and the write enable signal 128-2 will be, hereinafter, collectively referred to as control signals 128. The external clock signal 126 and the control signals 128 may be used to generate the test signals based on certain standard protocols.

Further, the PSG 114 may control the number of bits of the data signal that can be generated to test the IO cells 110. In an implementation, one data strobe signal is associated with at least eight bits of the data signal. The data signals, the data strobe signal, and the clock signal may be sequenced according to standard protocol(s), such as relating to read signal latency, write signal latency, or synchronization of the data strobe signal with the clock signal.

The controller 112 and the PSG 114 are coupled to the switching unit 116. The switching unit 116 is coupled to the controller 112 through the controller data bus 122. The switching unit 116 transfers the data signals from the controller data bus 122 to the IO cells 110 during the normal mode of operation. The switching unit 116 is also coupled to the PSG 114 through a test signal bus 130. The test signal bus 130 receives the test signals generated by the PSG 114. The switching unit 116 sends the test signals from the test signal bus 130 to the IO cells 110 during the test mode of operation.

During the test mode of operation, the characteristics of the test signals, after passing through the IO cells 110, are analyzed by the analyzer 104. The analyzer 104 measures the test signals to test characteristics, such as a cycle-to-cycle jitter and a clock period jitter, of the IO cells 110. Since the PSG 114 can control the number of IO cells 110 for which the data signals will be generated, the effect of characteristics such as crosstalk, reflections, and line-to-line jitter can also be measured. All these characteristics are dependant on the number of the IO cells 110 being operated at a time.

Figure 2A:
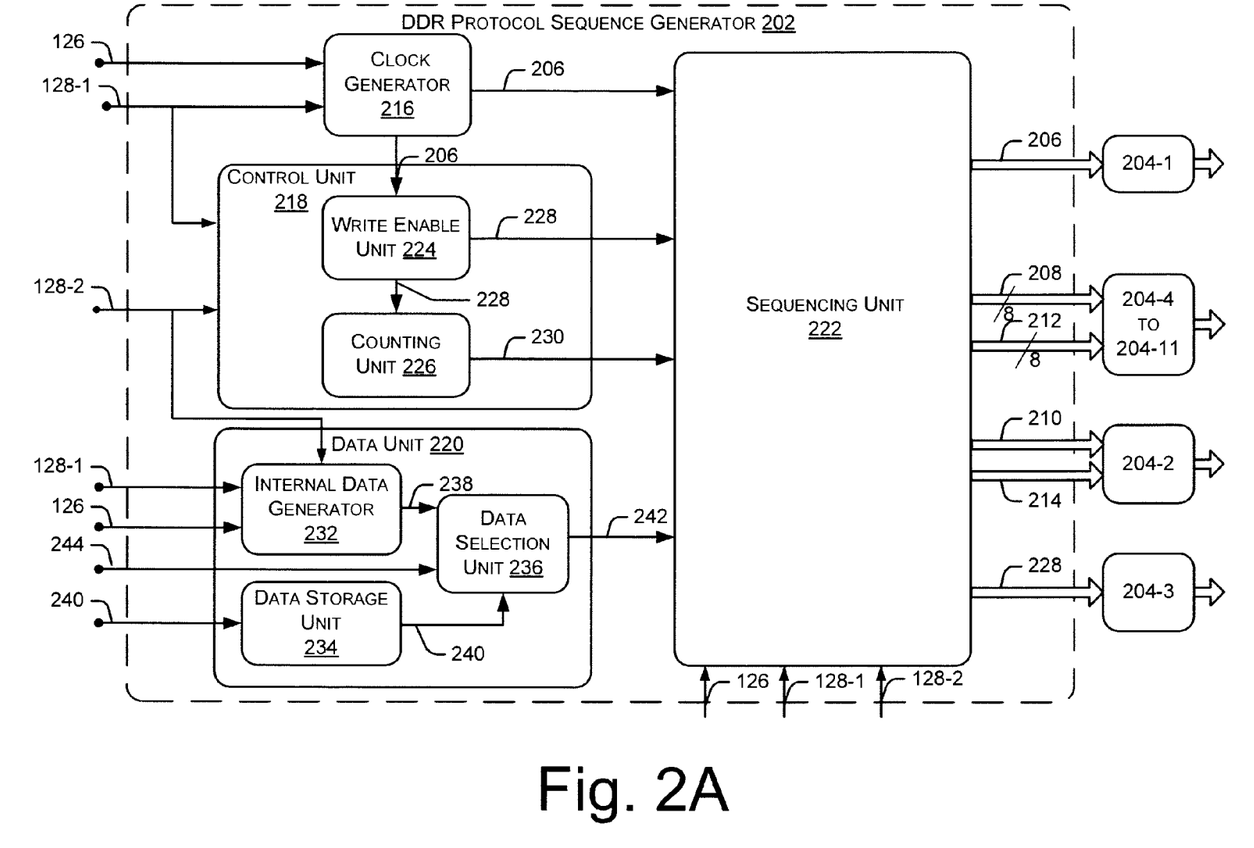
FIG. 2A illustrates an exemplary architecture of a Dual Data Rate (DDR) protocol sequence generator (DPSG) implemented in an IC chip.

FIG. 2A illustrates an embodiment of the PSG 114, in accordance with the present subject matter. The PSG 114 has been explained in terms of a DDR protocol sequence generator (DPSG) 202. The DPSG 202 generates test signals to test characteristics of DDR IO cells 204-1, 204-2, . . . , 204-m, collectively referred to as DDR IO cells 204. However, it will be understood that the present embodiment of the PSG 114 as the DPSG 202 is for illustrative purposes only, and therefore the scope of the present subject matter should not be considered limiting as such.

The DPSG 202 generates the test signals including a DDR clock signal 206; eight bits of a data signal 208-1, 208-2, . . . , 208-8, collectively referred to as data signals 208; and a data strobe signal 210. For the purpose, the DPSG 202 receives signals including the external clock signal 126 and the control signals 128, for example, the reset signal 128-1, the write enable signal 128-2, etc., and generates the DDR clock signal 206. The DPSG 202 can generate the data signals 208 internally or receive the data signals 208 externally.

The DPSG 202 generates the data strobe signal 210 based on the external clock signal 126 and the control signals 128. The DDR clock signal 206, the data signals 208, and the data strobe signal 210 are sequenced by the DPSG 202 to generate the test signals. The sequencing of the test signals is achieved based on the external clock signal 126. In an implementation, the external clock signal 126 has a frequency double than that of the DDR clock signal 206. Also, the data signals 208 and the data strobe signal 210 are generated at alternate edges of the external clock signal 126. These and other features of the DPSG 202 have been explained in greater detail in the following paragraphs.

The data signals 208 along with the data strobe signal 210 are communicated to the DDR IO cells 204. For example, the data signals 208, are communicated with the data strobe signal 210. The following description has been explained with respect to the data signals 208 generated by the DPSG 202. However, it will be understood that the generation of multiple bits of the data signal and corresponding data strobe signals is also within the scope of the present subject matter.

The test signals simulate a write cycle in the DDR SDRAM. For example, during a write operation to the DDR SDRAM, the data strobe signal 210 may be in high impedance state till a write latency period has elapsed. The write latency period is the time period after which the controller 112 reacts upon receiving a control signal, such as the write enable signal 128-2, from the processor. In one implementation, the write latency period is simulated by the DPSG 202 by generating the data signals 208 and the data strobe signal 210 after the write latency period is over. The DPSG 202 may also generate multiple bits of data enable signals 212-1, 212-2, . . . , 212-8, collectively referred to as data enable signals 212, and a data strobe enable signal 214 to simulate the high impedance state in the test signals during the write latency period.

Further, the data strobe signal 210 may have to follow a preamble, for half clock cycle, before the data signals 208 are communicated, and a postamble after the data signals 208 are communicated. As the data signals 208 are continuously provided by the DPSG 202, there may be no need to generate the postamble. The data strobe signal 210 and the DDR clock signal 206, in an implementation, is a single mode signal.

However, it will be understood that a differential signal implementation of the data strobe signal 210 and the DDR clock signal 206 is also possible and is within the scope of the present subject matter.

The DPSG 202 includes a clock generator 216, a control unit 218, a data unit 220, and a sequencing unit 222 for generating the test signals. The DPSG 202 starts functioning upon the instantiation of the test mode of operation. The test mode of operation may be instantiated upon receiving the test mode enable signal 124 from an IO cell, for example, the IO cell 110-4. Upon instantiation of the test mode of operation, the clock generator 216 receives the external clock signal 126 to generate the DDR clock signal 206. The DDR clock signal 206 may be provided to a DDR IO cell, for example, the DDR IO cell 204-1. The external clock signal 126 may be provided by any of the commonly known signal generators, for example, a function generator. The DDR clock signal 206 can be provided to the DDR IO cells 204 to exchange write data with the memory. In an implementation, the DDR clock signal 206 is at a frequency one-half of the frequency of the external clock signal 126. The DDR clock signal 206 can also be provided to the sequencing unit 222 for generation of the test signals. The external clock signal 126 may be received through an IO cell, for example the IO cell 110-1.

The DDR clock signal 206 is provided to the control unit 218 for synchronizing the write enable signal 128-2. The control unit 218 includes a write enable unit 224 and a counting unit 226. The write enable unit 224 receives the write enable signal 128-2 along with the DDR clock signal 206 to generate a synchronized write enable signal 228. The synchronized write enable signal 228 can be generated by synchronizing the write enable signal 128-2 with either the rising edge or the falling edge of the DDR clock signal 206.

The counting unit 226 in the DPSG 202 receives the write enable signal 128-2 and the synchronized write enable signal 228 and, in response, initiates a counter. The counter may be used to sequence the test signals according to the standard protocols. For example, the counting unit 226 generates counter signal bits 230 to introduce the write latency period between the synchronized write enable signal 228 and the data signals 208.

As mentioned previously, the DPSG 202 includes the data unit 220. The data unit 220 includes a internal data generator 232, a data storage unit 234, and a data selection unit 236. The internal data generator 232 receives the external clock signal 126 and the write enable signal 128-2 to generate internal data signals 238. The internal data signals 238 may be of multiple bit resolution to allow testing of multiple DDR IO cells simultaneously. In an implementation, the internal data signals 238 is an eight bit signal to test eight of the DDR IO cells 204-4 to 204-11 simultaneously. The internal data signals 238 starts from an initial all zero value and keeps on incrementing by one.

The data storage unit 234 receives external data signals 240 and stores them. The external data signals 240 may also be of multiple bit resolution to allow testing of multiple DDR IO cells, for example, the DDR IO cells 204-4 to 204-11, simultaneously. In an implementation, the external data signals 240 is of three bit resolution. The three bits may get distributed among the external data signals 240 in the following manner: the DDR IO cells 204-4 and 204-8 receive the first bit, the DDR IO cells 204-5 and 204-9 receive the second bit, and the rest of the DDR IO cells 204-6 and 204-7 and 204-10 and 204-11 receive the third bit.

The data selection unit 236 selects write data signals 242 from amongst the internal data signals 238 and the external data signals 240. The selection of the write data signals 242 is based on a data select signal 244. The data selection unit 236 receives the data select signal 244 to decide upon the write data signals 242 to be selected. Upon determining a level of the data select signal 244, the internal data signals 238 generated by the internal data generator 232 are selected as the write data signals 242. In another case, the external data signals 240 from the data storage unit 234 are selected as the write data signals 242.

The DPSG 202 also includes the sequencing unit 222. The sequencing unit 222 generates the test signals in accordance with the write cycle of the DDR SDRAM. For the purpose, the sequencing unit 222 receives the DDR clock signal 206, the synchronized write enable signal 228, the counter signal bits 230, and the write data signals 242. The sequencing unit 222 also receives the external clock signal 126 and the write enable signal 128-2 for sequencing the test signals. The sequencing unit 222 ensures that the data signals 208 and the data strobe signal 210 are generated after the write latency period has elapsed. The sequencing unit 222 also generates the data enable signals 212 and the data strobe enable signal 214 to ensure that during the write latency period, the data signals 208 and the data strobe signal 210 are in the high impedance state. The working of the sequencing unit 222 has been explained in greater detail with reference to FIG. 2B.

Figure 2B:
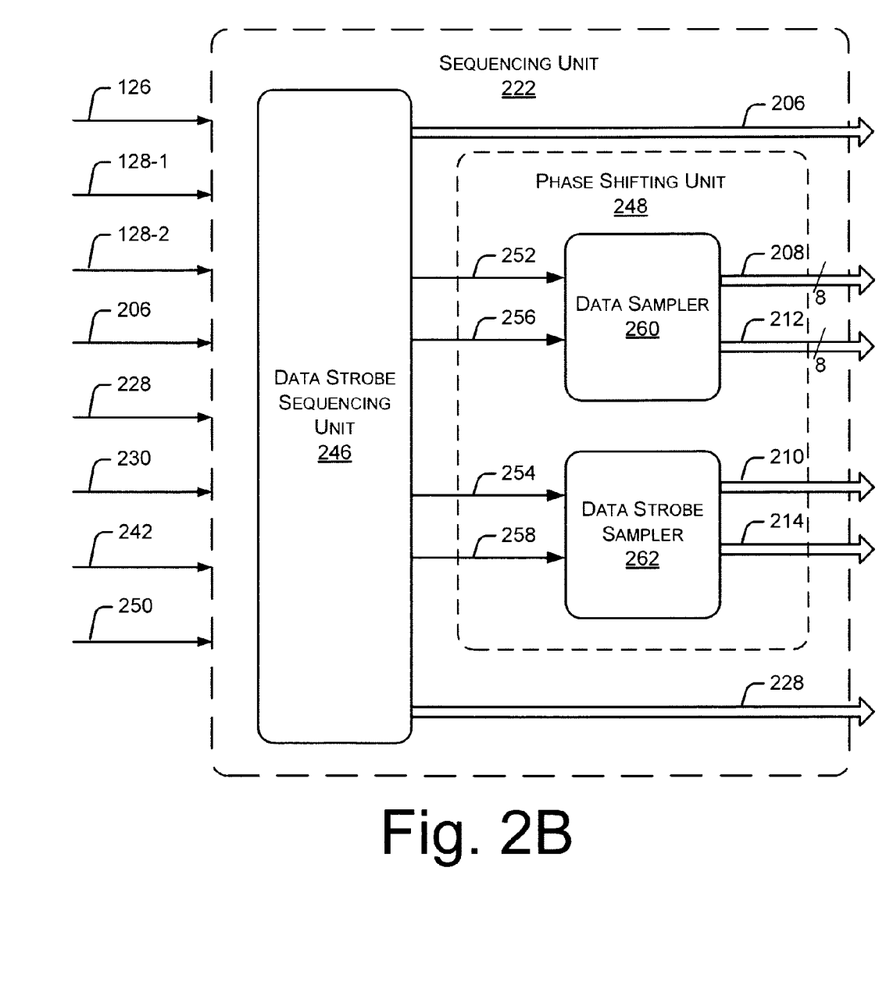
FIG. 2B illustrates an exemplary architecture of a sequencing unit of the DPSG shown in FIG. 2A.

FIG. 2B illustrates an embodiment of the sequencing unit 222 of the DPSG 202, in accordance with an embodiment of the present subject matter. The sequencing unit 222 includes a data strobe sequencing unit 246 and a phase shifting unit 248.

The data strobe sequencing unit 246 receives a data debug signal 250. The data debug signal 250 may be used for debugging the DDR IO cells 204 by selecting a variable number of the DDR IO cells 204-4 to 204-11. For illustration purpose, if the data debug signal 250 is of a three bit resolution, a "000" value may indicate that the data signals 208 will be generated for all the DDR IO cells 204-4 to 204-11. Likewise, a value "001" may indicate that only seven of the DDR IO cells 204-4 to 204-11 that communicate data should be provided with the bits of the data signals 208-1 to 208-7. In addition, the characteristics of the DDR IO cells 204, such as line-to-line jitter and crosstalk, can also be analyzed in relation to the number of the DDR IO cells 204 currently operating.

The data strobe sequencing unit 246 also receives the DDR clock signal 206, the synchronized write enable signal 228, the external clock signal 126, the write enable signal 128-2, and the write data signals 242 generated from the various blocks as described in FIG. 2A.

The data strobe sequencing unit 246 generates internal write data signals 252 from the write data signals 242 to sequence the test signals. The internal write data signals 252 may be a delayed version of the write data signals 242. The data strobe sequencing unit 246 also generates an internal data strobe signal 254 for generating the data strobe signal 210. In addition, the data strobe sequencing unit 246 generates internal data enable signals 256 for the data signals 208 and an internal data strobe enable signal 258 for the data strobe signal 210. The internal data enable signals 256 and the internal data strobe enable signal 258 may be used to generate the high impedance state for the DDR IO cells 204.

For example, after the write enable signal 128-2 is high, the data signals 208 remain in the high impedance state until the write latency period is over. The internal write data signals 252 and the internal data enable signals 256 may be synchronized by the data strobe sequencing unit 246. Similarly, the internal data strobe signal 254 and the internal data strobe enable signal 258 may be synchronized by the data strobe sequencing unit 246. The internal data strobe signal 254 synchronized with the internal data strobe enable signal 258 and the internal write data signals 252 synchronized with the internal data enable signals 256 are provided to the phase shifting unit 248.

The phase shifting unit 248 includes a data sampler 260 and a data strobe sampler 262. The phase shifting unit 248 introduces a quarter phase shift between the data signals 208 and the data strobe signal 210. The data sampler 260 receives the external clock signal 126, the internal write data signals 252, and the internal data enable signals 256 to generate the data signals 208. The data sampler 260 samples the internal write data signals 252 at negative edges of the external clock signal 126. The data sampler 260 samples the internal data enable signals 256 at the negative edges of the external clock signal 126 as well, to generate the data enable signals 212 for the DDR IO cells 204-4 to 204-11. The data enable signals 212 may be used to generate the high impedance state for the DDR IO cells 204-4 to 204-11.

Similarly, the data strobe sampler 262 receives the external clock signal 126, the internal data strobe signal 254, and the internal data strobe enable signal 258 to generate the data strobe signal 210. The data strobe sampler 262 samples the internal data strobe signal 254 and the internal data strobe enable signal 258 at positive edges of the external clock signal 126. The data strobe sampler 262 samples the internal data strobe enable signal 258 at positive edges of the external clock signal 126 as well, to generate the data strobe enable signal 214 for the DDR IO cell 204-2. The data strobe enable signal 214 may be used to generate the high impedance state for the DDR IO cell 204-2.

The sampling by the data sampler 260 at the negative edge of the external clock signal 126 and by the data strobe sampler 262 at the positive edge of the external clock signal 126 introduces a quarter phase shift between the data signals 208 and the data strobe signal 210. The data strobe signal 210 is edge aligned to the DDR clock signal 206 by the phase shifting unit 248. As the external clock signal 126 is at a frequency double than that of the DDR clock signal 206, the quarter phase shift may also be achieved by sampling the two signals at alternate edges of the external clock signal 126. This has been explained in detail later, with the help of FIG. 3 and FIG. 4.

It should be noted that the various units shown in FIG. 2, such as the clock generator 216, the write enable unit 224, the counting unit 226, the internal data generator 232, the data strobe sequencing unit 246, the data sampler 260, and the data strobe sampler 262, receive the reset signal 128-1 so as to override any functioning of these units. The reset signal 128-1 generates a low output value at the DDR IO cells 204 when the reset signal 128-1 is low.

Figure 3A:
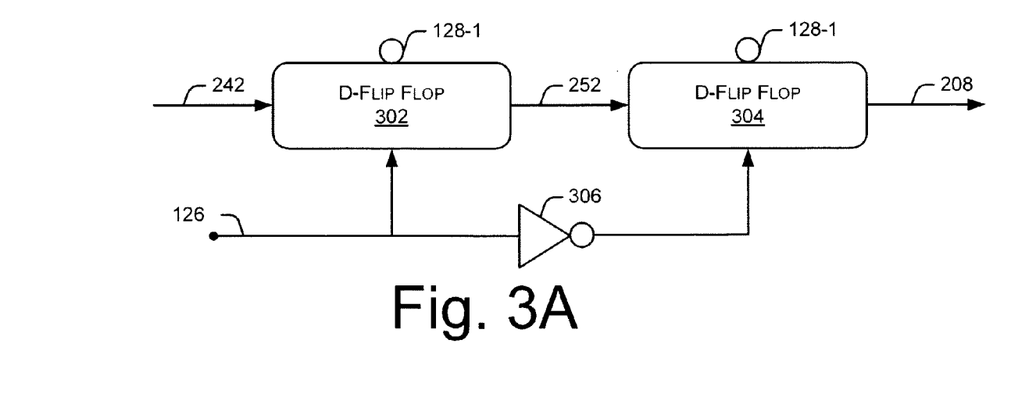
FIG. 3 illustrates an exemplary implementation to sequence data signals and data enable signals.

FIG. 3A illustrates the generation of the data signals 208, in accordance with an implementation of the present subject matter. In the present implementation, D-flip flops 302 and 304 may be used as synchronizing components to generate the data signals 208 from the write data signals 242. The data signals 208 form a part of the test signals, as mentioned previously. The D-flip flop 302 samples the write data signals 242 at a positive edge of the external clock signal 126 to generate the internal write data signals 252. The D-flip flop 304 then samples the internal write data signals 252 at a negative edge of the external clock signal 126 to generate the data signals 208. Further, an inverter 306 is used to invert the external clock signal 126, which is then used to sample the internal write data signals 252.

Figure 3B:
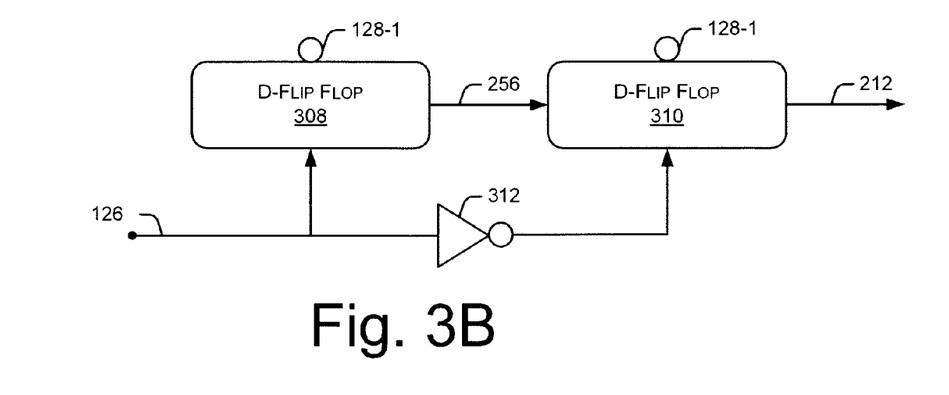

FIG. 3B illustrates the generation of the data enable signals 212, in accordance with an implementation of the present subject matter. In said implementation, synchronizing components may be used to generate the data enable signals 212 from the internal data enable signals 256. For the purpose, the sequencing unit 222 includes D-flip flops 308 and 310. The D-flip flop 308 generates the internal data enable signals 256 by sampling at the positive edge of the external clock signal 126. The D-flip flop 310 then samples the internal data enable signals 256 at the negative edge of the external clock signal 126 to generate the data enable signals 212. The negative edge of the external clock signal 126 is generated using an inverter 312. It will be understood that the flip flops sample the internal write data signals 252 and the internal data enable signals 256 at complimentary edges of the external clock signal 126.

Figure 4A:
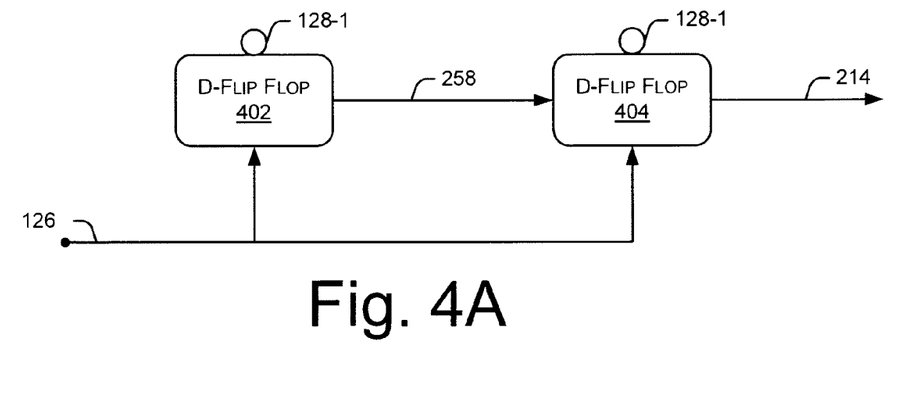
FIG. 4 illustrates an exemplary implementation to generate a data strobe signal and a data strobe enable signal.

FIG. 4A illustrates the generation of the data strobe enable signal 214, in accordance with an implementation the present subject matter. According to the implementation, D-flip flops 402 and 404 may be used as synchronizing components to generate the data strobe enable signal 214 from the internal data strobe enable signal 258. The D-flip flop 402 generates the internal data strobe enable signal 258 by sampling at a positive edge of the external clock signal 126. The D-flip flop 404 then samples the internal data strobe enable signal 258 at the positive edge of the external clock signal 126 to generate the data strobe enable signal 214.

Figure 4B:
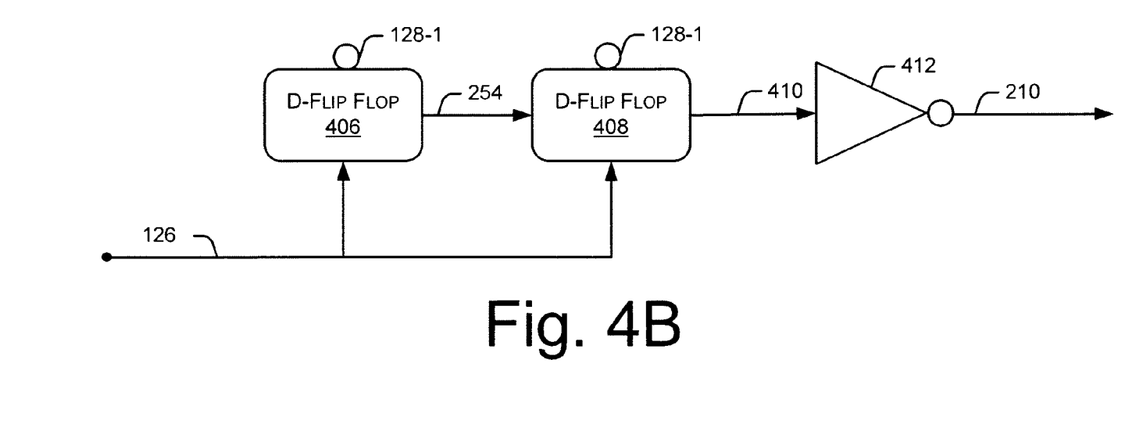

FIG. 4B illustrates the generation of the data strobe signal 210, in accordance with an implementation of the present subject matter. According to the implementation, D-flip flops 406 and 408 may be used as synchronizing components to generate the data strobe signal 210 from the internal data strobe signal 254. The D-flip flop 406 generates the internal data strobe signal 254 by sampling at a positive edge of the external clock signal 126. The D-flip flop 408 then samples the internal data strobe signal 254 at the positive edge of the external clock signal 126 to generate an intermediate signal 410.

The intermediate signal 410 is inverted using an inverter 412 to generate the data strobe signal 210. The inverter 412 helps to introduce a preamble in the data strobe signal 210 before the data signals 208 are generated. The duration of the preamble is half the period of the DDR clock signal 206, and the data strobe signal 210 is low for that period. It will be understood that any other synchronizing devices, such as JK flip-flops, and T flip-flops, can be used in place of the D flip-flops. Also, one can understand that the sampling of the signals can happen at any edge of the external clock signal 126. Mentioning positive and negative edges is just for the purpose of explanation and should not be construed as a limitation.

Figure 5:
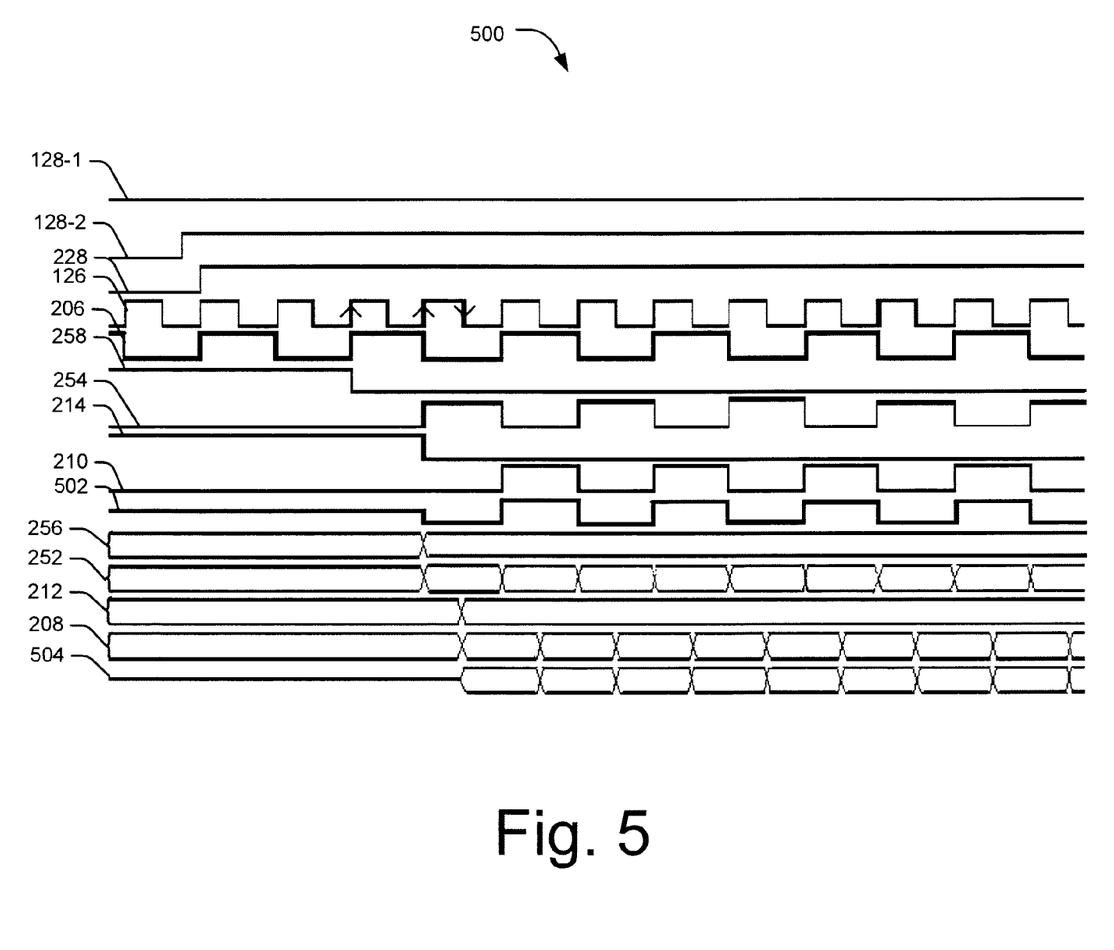
FIG. 5 illustrates an exemplary waveform diagram illustrating the timing and functional relationships of signals generated by the DPSG.

FIG. 5 illustrates a timing diagram 500 depicting the test signals as generated by the DPSG 202, in accordance with an implementation of the present subject matter. For illustration purposes, the test signals have been generated simulating a write cycle in a DDR SDRAM. The test signals may be generated by various blocks of the DPSG 202, as explained with reference to FIGS. 2 to 4.

As discussed earlier, the test signals may be generated upon instantiation of the test mode of operation when the reset signal 128-1 is high. FIG. 5 shows the reset signal 128-1 and the write enable signal 128-2. The write enable signal 128-2 is synchronized with an edge of the external clock signal 126 to generate the synchronized write enable signal 228, as shown. As shown in the figure, the DDR clock signal 206 is at half the frequency of the external clock signal 126.

The data strobe signal 210 may be sequenced after the write latency period is over. The write latency period as illustrated is two clock cycles of the DDR clock signal 206. As the external clock signal 126 is double the frequency of the DDR clock signal 206, the write latency period corresponds to four clock cycles of the external clock signal 126. Thus, the data strobe signal 210 is sequenced after two clock cycles of the DDR clock signal 206 after receiving the write enable signal 128-2. During the two clock cycles of the DDR clock signal 206, the data strobe signal 210 remains in the high impedance state.

For illustrating the above mentioned sequencing, the internal data strobe enable signal 258, the internal data strobe signal 254, the data strobe enable signal 214, and the data strobe signal 210 are shown. Upon receiving the synchronized write enable signal 228, the internal data strobe enable signal 258 changes from high to low after two clock cycles of the external clock signal 126. The data strobe enable signal 214 correspondingly changes from high to low at the next positive edge of the external clock signal 126. The corresponding positive edges of the external clock signal have been marked with up-arrows, as shown in FIG. 5.

The data strobe enable signal 214 is provided to an enable pin of the DDR IO cells 204 to generate the high impedance signal. The enable pin of the DDR IO cells 204 may be an active low pin, which allows exchange of signals through the DDR IO cells 204 when an enable signal is low. The data strobe enable signal 214, generated as the enable signal, turns low after three clock cycles of the external clock signal 126 so that the preamble of the data strobe signal 210 can be generated.

The internal data strobe signal 254 starts conducting in synchronization with the data strobe enable signal 214. Correspondingly, the data strobe signal 210 is sampled at the next positive edge of the external clock signal 126, as described in FIG. 4. The data strobe signal 210 thus starts after the write latency period has elapsed. Row 502 depicts the data strobe signal 210 after passing through the DDR IO cells 204. The data strobe signal 210 is in the high impedance state before the write enable signal 128-2 and before the write latency period has elapsed. The data strobe signal 210 also has the preamble. It should be noted that the data strobe signal 210 is edge aligned with the DDR clock signal 206.

The data signals 208 may also be sequenced after the write latency period has elapsed. In an implementation, the data signals 208 may be center aligned to the data strobe signal 210. Illustrating the sequencing of the data signals 208, the internal data enable signals 256, the internal write data signals 252, the data enable signals 212, and the data signals 208 are also shown.

The internal data enable signals 256 is sampled at the positive edge of the external clock signal 126 corresponding to the changing of the data strobe enable signal 214, as shown in FIG. 5. After sampling the internal data enable signals 256, the data enable signals 212 are generated by sampling the internal data enable signals 256 at a negative edge of the external clock signal 126, the negative edge being consecutive to the positive edge. The corresponding consecutive positive and negative edges of the external clock signal 126 have been marked with up-arrow and down arrow, as shown in FIG. 5. The sampling may be done to center align the data signals 208 with the data strobe signal 210. The data enable signals 212, as mentioned previously, are provided to the enable pins of the DDR IO cells 204 so that the high impedance state in the data signals 208 can be generated. The enable pins of the DDR IO cells 204 may be active low pins that communicate signals from the DDR IO cells 204 when the enable pins are low.

The internal write data signals 252 may be sampled at a positive edge of the external clock signal 126 corresponding to the changing of the data strobe enable signal 214. Correspondingly to this sampling, the internal write data signals 252 is sampled at a negative edge of the external clock signal 126 to generate the data signals 208, as described with reference to FIG. 3. The data signals 208 are thus generated in synchronization with the external clock signal 126 and the DDR clock signal 206. The data signals 208 are also center aligned with the data strobe signal 210, as depicted in FIG. 5. Row 504 shows the data signals 208 after passing through the DDR IO cells 204. As can be seen, these signals are in the high impedance state until the write latency period.

It will be understood that the above illustration is just for the purpose of explaining the present subject matter, and should not be, in any way, construed as a limitation of the present subject matter. As will be understood, there might be delays introduced by flip flops and other sequencing devices. Although the above explanation has been done with reference to sampling the signals at the positive edge of the external clock signal 126, the sampling can be done at any one edge of the external clock signal 126.

Figure 6:
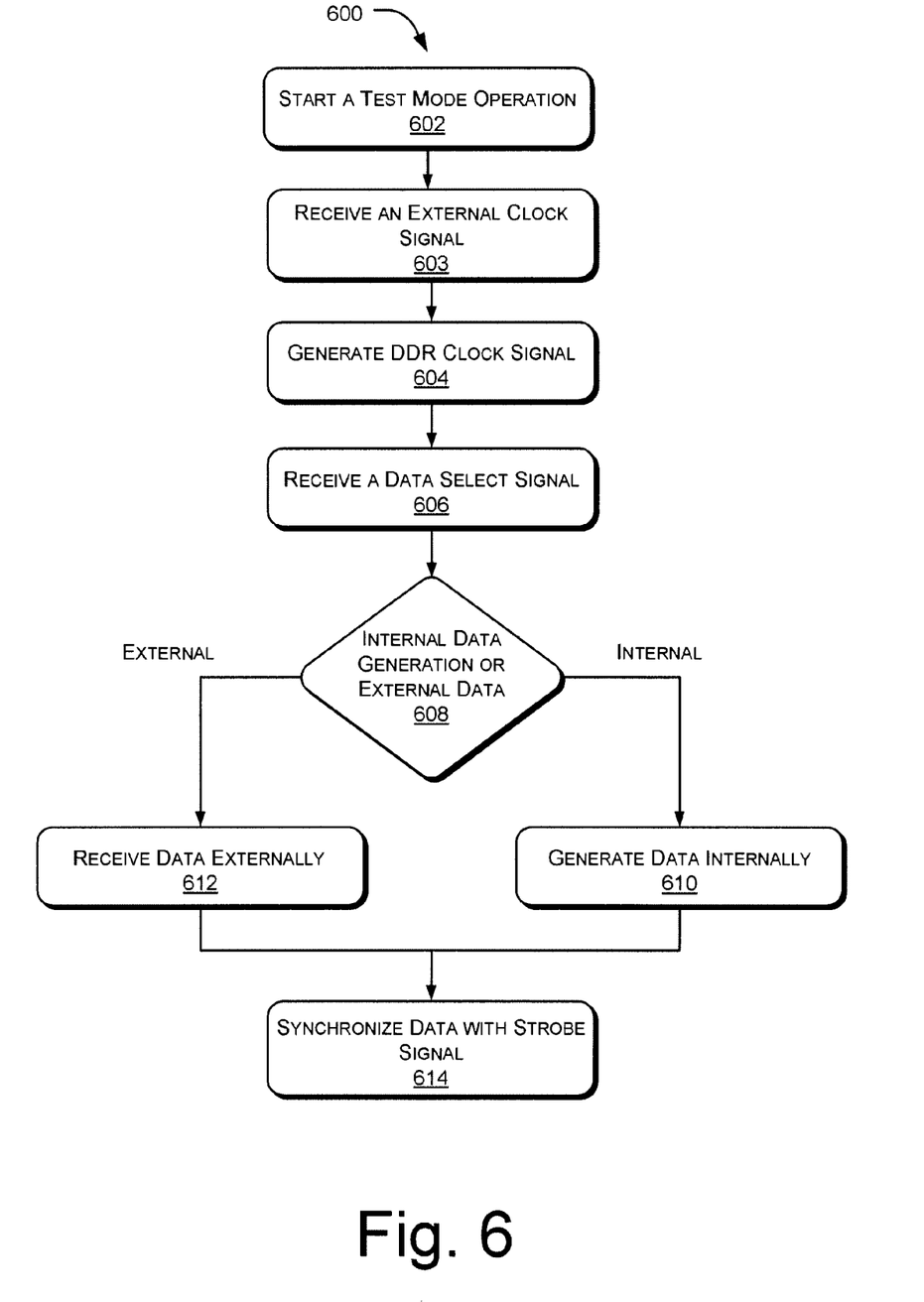
FIG. 6 illustrates an exemplary method to generate test signals for testing input-output (IO) cells in an IC chip.

FIG. 6 illustrates an exemplary method 600 to generate test signals for analyzing the characteristics of DDR IO cells. The characteristics may include jitter specifications such as cycle to cycle jitter, clock period jitter, and duty cycle jitter. The test signals may be generated in accordance with any standard protocol followed in the industry. For DDR SDRAM, the standard specifications have been specified by the JEDEC.

The order in which the method is described is not intended to be construed as a limitation, and any number of the described method blocks can be combined in any order to implement the method, or an alternate method. Additionally, individual blocks may be deleted from the method without departing from the spirit and scope of the subject matter described herein. Furthermore, the method can be implemented in any suitable hardware, software, firmware, or combination thereof.

At block 602, a test mode initialization command along with a write enable signal is received to start a test mode of operation. For example, the test mode enable signal 124 is received by the PSG 114 or the DPSG 202 to start the test mode of operation. Following the start of the test mode of operation test signals are generated to test characteristics of the DDR IO cells.

At block 603, an external clock signal is received. In an implementation, the PSG 114 receives the external clock signal 126 through an IO cell, for example, the IO cell 110-1.

At block 604, a DDR clock signal is generated from the received external clock signal. The frequency of the DDR clock signal is one-half the frequency of the external clock signal. In an implementation, the clock generator 216 receives the external clock signal 126 to generate the DDR clock signal 206, as described in FIG. 2.

At block 606, a data select signal is received to select a data source for providing a data signal to test characteristics of IO cells.

At block 608, a value of the data select signal is determined. Upon determining the value of the data select signal at block 608, the data signal is either generated at block 610 or received at block 612. For example, the data selection unit 236 of the DPSG 202 receives the data select signal 244 to select whether the write data signals 242 is selected as the internal data signals 238 or the external data signals 240.

At block 614, the data signal generated at block 610 or the data signal received at block 612, along with the DDR clock signal, is received to generate a DDR strobe signal. The DDR strobe signal, the data signal, and the DDR clock signal are then synchronized. For example, the data strobe sequencing unit 246 receives the write data signals 242 and the DDR clock signal 206. The data strobe sequencing unit 246 generates the internal data strobe signal 254. The data sampler 260 and the data strobe sampler 262 then sample the internal write data signals 252 and the internal data strobe signal 254 to generate the data signals 208 and the data strobe signal 210.

Although embodiments for generating a test signal for IO cells have been described in language specific to structural features and/or methods, it is to be understood that the present subject matter is not necessarily limited to the specific features or methods described. Rather, the specific features and methods are disclosed as exemplary embodiments for generating the test signal for the IO cells.

We claim:

1. A system comprising:
   a memory;
   a processor; and
   an integrated circuit (IC) chip coupled to the memory and to the processor, the IC chip comprising:
      a plurality of input-output (IO) cells;
      a controller to exchange signals between the memory and the processor through the plurality of IO cells; and
      a protocol sequence generator comprising a control unit to receive at least one control signal to generate at least one synchronized control signal, wherein the at least one synchronized control signal is synchronized with an external clock signal and a sequencing unit in communication with the IO cells to receive an internal clock signal derived from the external clock signal and the at least one synchronized control signal to generate test signals, said protocol sequence generator operative to generate test signals to test characteristics of the plurality of IO cells, wherein the protocol sequence generator generates the test signals based on said at least one synchronized control signal,
      wherein the protocol sequence generator is in communication with the cells through a switching unit, and the controller is in direct communication with the IO cells and also through the switching unit.

2. The system as claimed in claim 1, wherein each of the plurality of IO cells is a dual data rate (DDR) IO cell.

3. The system as claimed in claim 1, wherein at least one of the test signals is selected from a group of a DDR clock signal, a data strobe signal, and a pre-defined number of bits of data signal.

4. The system as claimed in claim 1, wherein the protocol sequence generator simulates the test signals corresponding to a write cycle in the memory.

5. The system as claimed in claim 1, wherein the controller, in a normal mode of operation, generates controller data signals for the plurality of IO cells.

6. The system as claimed in claim 5 wherein the switching unit provides the controller data signals to the plurality of IO cells during the normal mode of operation and to provide the test signals to the plurality of IO cells during a test mode of operation.

7. The system as claimed in claim 1, wherein the protocol sequence generator further comprises a data unit to generate write data signals for the test signals.

8. The system as claimed in claim 7, wherein the data unit selects the write data signals, based on a data select signal, from internal data signals and external data signals.

9. The system as claimed in claim 1, wherein the protocol sequence generator further comprises a clock generator to receive the external clock signal to generate a DDR clock signal having a frequency that is half the frequency of the external clock signal.

10. The system as claimed in claim 1, wherein the control unit further comprises a counting unit to initiate a counter based on receiving the at least one synchronized control signal, wherein the counter generates counter signal bits to sequence the test signals.

11. The system as claimed in claim 1, wherein the sequencing unit generates test signals comprising a DDR clock signal, a data strobe signal, and at least one bit of data signal.

12. The system of claim 1, wherein the sequencing unit comprises:
   a data sampler to sample write data signals and internal data enable signals at an edge of said external clock signal to generate at least one bit of a data signal and corresponding data enable signals; and
   a data strobe sampler to sample an internal data strobe signal and an internal data strobe enable signal at an opposite edge of the external clock signal to generate a data strobe signal and corresponding data strobe enable signal.

13. The system as claimed in claim 12, wherein the sequencing unit comprises a data strobe sequencing unit to determine, based on a data debug signal, a pre-defined number of the at least one bit of the data signal.

* * * * *

UNITED STATES PATENT AND TRADEMARK OFFICE
CERTIFICATE OF CORRECTION

PATENT NO.       : 8,489,943 B2  
APPLICATION NO.  : 12/751111  
DATED            : July 16, 2013  
INVENTOR(S)      : Anil K. Dwivedi et al.

Page 1 of 1

It is certified that error appears in the above-identified patent and that said Letters Patent is hereby corrected as shown below:

In the Claims

Column 13, line 36, after "the" insert --IO--

Signed and Sealed this
Fifth Day of November, 2013

Teresa Stanek Rea
*Deputy Director of the United States Patent and Trademark Office*